US010177710B1

(12) United States Patent
Slezak

(10) Patent No.: US 10,177,710 B1
(45) Date of Patent: Jan. 8, 2019

(54) SYSTEM AND METHOD FOR LOSSLESS PHASE NOISE CANCELLATION IN A MICROELECTROMECHANICAL SYSTEM (MEMS) RESONATOR

(71) Applicant: Lockheed Martin Corporation, Bethesda, MD (US)

(72) Inventor: Leon J Slezak, Moorestown, NJ (US)

(73) Assignee: Lockheed Martin Corporation, Bethesda, MD (US)

( * ) Notice: Subject to any disclaimer, the term of this patent is extended or adjusted under 35 U.S.C. 154(b) by 137 days.

(21) Appl. No.: 15/267,710

(22) Filed: Sep. 16, 2016

(51) Int. Cl.
*H03B 28/00* (2006.01)
*H03H 9/25* (2006.01)
*H03H 9/24* (2006.01)

(52) U.S. Cl.
CPC .......... *H03B 28/00* (2013.01); *H03H 9/2405* (2013.01); *H03H 9/25* (2013.01)

(58) Field of Classification Search
CPC .................................................. H03B 28/00
USPC ..................................................... 331/158
See application file for complete search history.

(56) References Cited

U.S. PATENT DOCUMENTS 5,194,830 A * 3/1993 Fleischmann ............ H03H 9/25 310/313 D
5,491,604 A * 2/1996 Nguyen ............ G01R 33/0286 331/116 M

* cited by examiner

*Primary Examiner* — Joseph Chang
(74) *Attorney, Agent, or Firm* — Howard IP Law Group

(57) ABSTRACT

An oscillator circuit including a microelectromechanical system (MEMS) resonator is provided. The circuit includes a surface acoustic wave (SAW) resonator having a first input transducer responsive to a first input signal for transducing the first input signal into mechanical motion of a substrate material of the resonator, a second input transducer responsive to a second input signal for transducing the second input signal into mechanical motion of the substrate material, and a first output transducer configured to transduce the mechanical motion of the substrate material of the resonator into an output electrical signal. A feedback loop is provided and configured to generate the second input signal, wherein the second input signal is indicative of a detected phase error of the output of the resonator.

17 Claims, 5 Drawing Sheets

SYSTEM AND METHOD FOR LOSSLESS PHASE NOISE CANCELLATION IN A MICROELECTROMECHANICAL SYSTEM (MEMS) RESONATOR

FIELD OF THE INVENTION

The present disclosure relates to microelectromechanical system (MEMS) resonators, and more particularly, to low phase noise electronic oscillators or oscillating circuits utilizing the same.

BACKGROUND OF THE INVENTION

Electronic oscillators for generating periodic or oscillating signals are fundamental to many radar, communication and clock systems. These circuits may take on many different configurations, including those which utilize MEMS resonators, such as surface acoustic wave (SAW) resonators, to produce a single frequency oscillating signal. For electronic oscillators, including those utilizing MEMS resonators, phase noise is a significant limiting factor in system performance. For example, an ideal oscillator generates a pure sine wave with all signal power occurring at a single frequency. However, in practice, the output signals of oscillators include phase modulated noise components that spread signal power to adjacent frequencies and result in noise sidebands.

Electronic oscillators may utilize various cancellation schemes in an effort to reduce these phase errors. For example, a conventional noise cancellation technique may include the use of a voltage controlled radio frequency (RF) phase shifting circuit responsive to the output of a resonator, as well as to a phase error feedback signal, for generating a phase-corrected output signal. However, the phase noise floor of the oscillator as a whole is a function of, and thus limited by, insertion losses associated with these phase shifting circuits. This is due to the thermal noise floor limiting the absolute floor at room temperature to nominally −174 dBm/Hz which is defined by K T B, where K is Boltzmann's constant in Joules/° K (Kelvin), T is temperature in ° K, and B is the overall bandwidth in Hz. This is referred to as "thermal noise" because of the dependency on temperature. Reducing the loop insertion loss allows for an increase in signal to noise ratio limited only by the power internal to the oscillator loop.

Alternative systems and methods for providing low phase noise in electronic oscillators utilizing MEMs resonators are desired.

SUMMARY

In one embodiment of the present disclosure, an oscillating circuit is provided. The circuit includes a SAW resonator having a first input transducer responsive to a first input signal for transducing the first input signal into mechanical motion of a substrate material of the resonator, a second input transducer responsive to a second input signal for transducing the second input signal into mechanical motion of the substrate material, and an output transducer configured to transduce the resulting mechanical motion of the substrate material of the resonator into an output oscillating signal. A feedback loop is provided and configured to generate the second input signal, wherein the second input signal is indicative of a phase error of the output oscillating signal of the resonator.

In another embodiment of the present disclosure, a MEMS resonator system is provided. The system includes a resonator element having a first input transducer configured to receive a first input signal for transducing the first input signal into mechanical motion of a substrate material of the resonator, and a second input transducer configured to receive a second input signal for transducing the second input signal into mechanical motion of the substrate material. A first output transducer of the resonator is configured to transduce the mechanical motion of the substrate material into an output electrical signal.

In another embodiment of the present disclosure, a method of correcting phase errors or phase noise of an oscillating signal generated by a MEMS resonator is provided. The method includes the steps of converting a first electrical signal into mechanical motion of the resonator with a first input transducer of the resonator, and converting the resulting mechanical motion of the resonator into an oscillating electrical signal with an output transducer of the resonator. A second electrical signal indicative of a detected phase error of the oscillating signal is converted into mechanical motion of the resonator with a second input transducer of the resonator.

DETAILED DESCRIPTION

Figure 1:
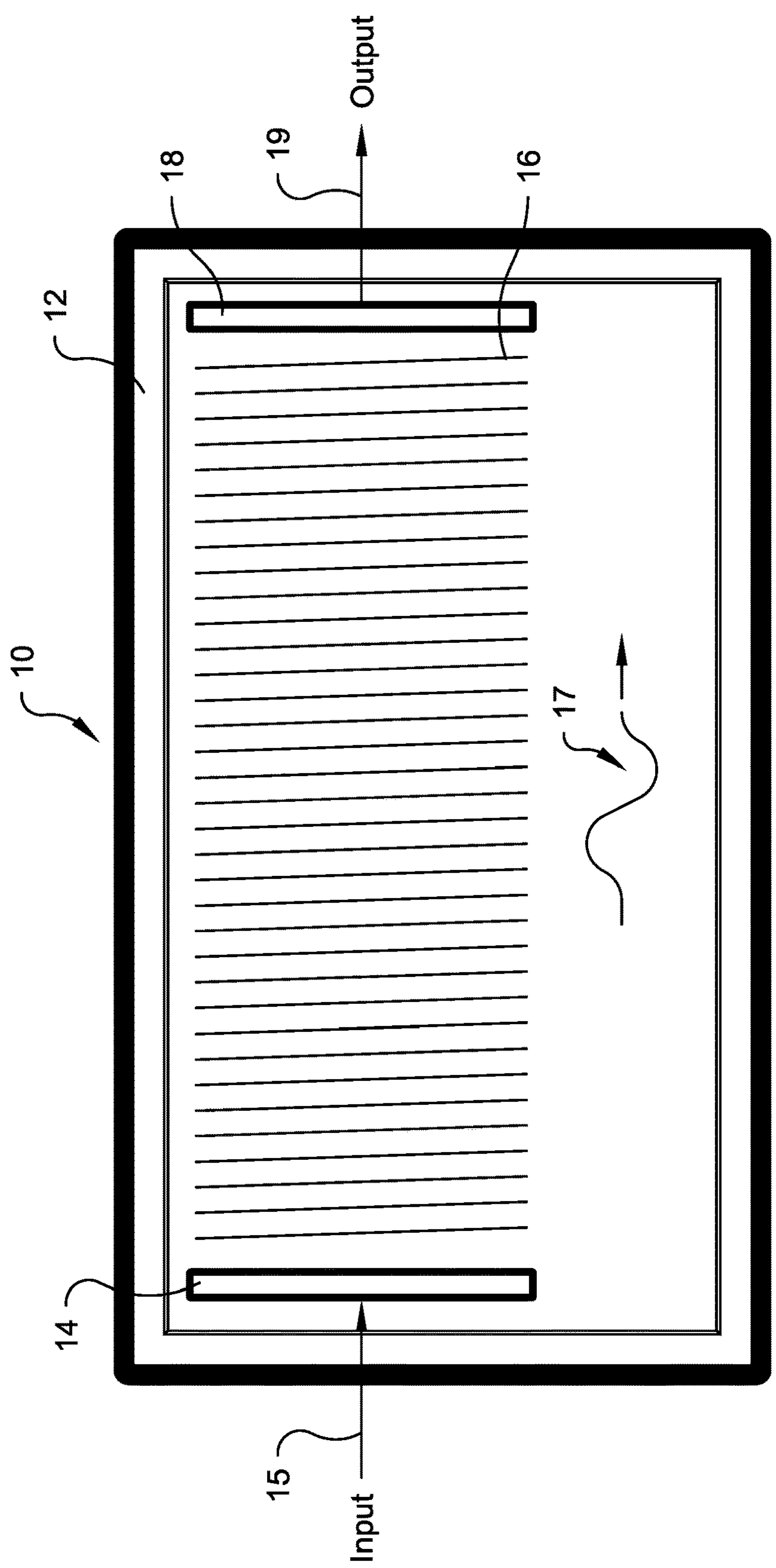
FIG. 1 illustrates a simplified MEMS resonator according to the prior art.

It is to be understood that the figures and descriptions of the present invention have been simplified to illustrate elements that are relevant for a clear understanding of the present invention, while eliminating, for purposes of clarity, many other elements found in electronic oscillators, including MEMS resonator-based oscillating circuits. However, because such elements are well known in the art, and because they do not facilitate a better understanding of the present invention, a discussion of such elements is not provided herein. The disclosure herein is directed to all such variations and modifications known to those skilled in the art.

In the following detailed description, reference is made to the accompanying drawings that show, by way of illustration, specific embodiments in which the invention may be practiced. It is to be understood that the various embodiments of the invention, although different, are not necessarily mutually exclusive. Furthermore, a particular feature, structure, or characteristic described herein in connection with one embodiment may be implemented within other embodiments without departing from the scope of the invention. In addition, it is to be understood that the location or arrangement of individual elements within each disclosed embodiment may be modified without departing from the scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout several views.

By way of background, FIG. 1 illustrates of a simplified conventional MEMS SAW resonator 10. Resonator 10 may be formed on a substrate 12 (e.g., a diamond, lithium, niobate, quartz, or lithium tantalate) and includes an input transducer 14 for converting a received electrical input signal 15 to mechanical motion of the substrate material 12 (e.g., SAWs 17). Input transducer 14 may comprise, for example, an electrostatic or piezoelectric interdigital transducer defining a plurality of electrodes or fingers. As will be understood, transducer 14 may be formed primarily by metallic material deposited via photolithographic process with vapor deposition, similar to integrated circuit processing techniques on the substrate. Non-piezoelectric substrates, such as a diamond substrates, may also comprise a piezoelectric material, such as lithium niobate printed thereon, with metal electrodes forming the transducer. One or more resonator elements 16 may be formed on or in substrate 12 resulting in a grating defined across a surface of substrate 12. More specifically, each resonator element 16 may comprise a frequency-tuned length of diamond crystal deposited on the substrate (e.g., by vapor deposition), and subsequently etched (e.g., lithographically patterned or plasma etched) to produce finger-like resonating structures for achieving a desired resonance condition.

An output transducer 18 is also provided for converting mechanical substrate motion back to an output oscillating signal 19 of a desired frequency. Output transducer 18 may also comprise, for example, an electrostatic or piezoelectric interdigital transducer defining a plurality of electrodes or fingers. As will be understood by one of ordinary skill in the art, a desired or target output frequency of the resonator is realized by properly defining the pitch of the input and output transducers electrodes, as well as the placement of the resonator elements formed or arranged therebetween.

Figure 2:
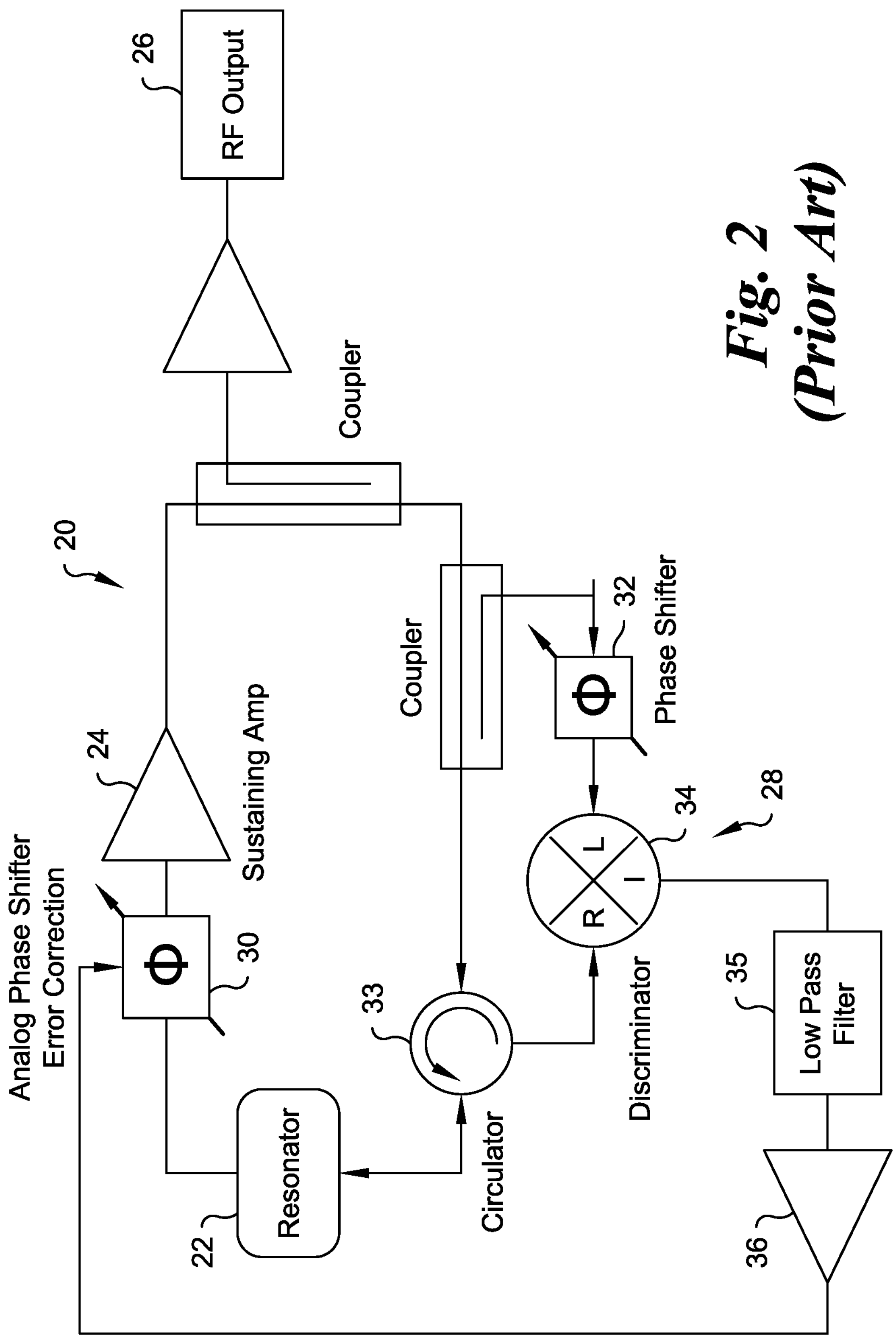
FIG. 2 illustrates a simplified oscillator circuit including a phase noise cancellation circuit utilizing the MEMS resonator according to FIG. 1.

As set forth above, MEMS resonators, such as that set forth above in FIG. 1, may be utilized in electrical circuits configured to generate oscillating output signals, including oscillator circuits having phase noise cancellation provisions. FIG. 2 provides an exemplary simplified oscillator circuit utilizing a SAW resonator similar to that set forth above with respect to FIG. 1. Circuit 20 includes a SAW resonator 22 having an output connected to a sustaining amplifier 24 used to drive resonator 22 via circulator 33 in continuous oscillation, and provide an output oscillating signal 26 of a desired frequency. As will be understood by one of ordinary skill in the art, sustaining amplifier 24 may be used detect the resonator motion and drive additional energy into the resonator as needed to maintain desired operation thereof.

Resonator circuit 20 further comprises a phase noise error correction circuit or feedback loop, including a phase detector or discriminator circuit, embodied in the illustrated embodiment as a simplified quadrature detector 28 and a voltage-controlled error correction phase shifter 30. As will be understood by one of ordinary skill in the art, quadrature detector 28 is configured to convert phase differences of two input signals into a voltage at the output of the circuit. As illustrated, quadrature detector 28 includes a phase shifter 32 (e.g., a delay line or LC network) configured to shift the phase of the output signal of sustaining amplifier 24 by 90 degrees. This phase-shifted signal is provided to a first input L of a frequency mixer 34. A second input R of frequency mixer 34 is responsive to a reflected signal from resonator 22 via circulator 33. More specifically, embodiments may utilize a reflected wave from the resonator to provide a "lossless" path to the RF signal inside the oscillatory loop. Circulator 33 is configured to provide this reflected wave, including any phase error distortion, to second input R of mixer 34. Frequency mixer 34 is used to multiply the two input signals together and output a signal proportional to the phase difference between the two signals.

As will be understood, if the phase difference of the two signals is equal to 90 degrees (quadrature), the voltage output by mixer 34 will be zero over time after low pass filtering the difference frequency between the two input signals via low pass filter 35, and integrating via amplifier 36 (e.g., a Miller integrator). However, any phase fluctuation over time from quadrature will result in a voltage fluctuation at the output of amplifier 36. Accordingly, the output of amplifier 36 defines a phase error correction signal, or a signal indicative of detected phase error over time. This error correction signal is supplied to voltage controlled error correction phase shifter 30 for cancelling detected phase noise at the output of resonator 22. While providing some improvement in the phase noise of the output oscillating signal 26, as set forth above, these embodiments suffer performance drawbacks, as the phase noise floor of the oscillator as a whole is a limited by insertion losses associated with error correction phase shifter 30. This insertion loss may be significant, for example between 2 and 5 dB, limiting the phase noise performance of the oscillator.

Figure 3:
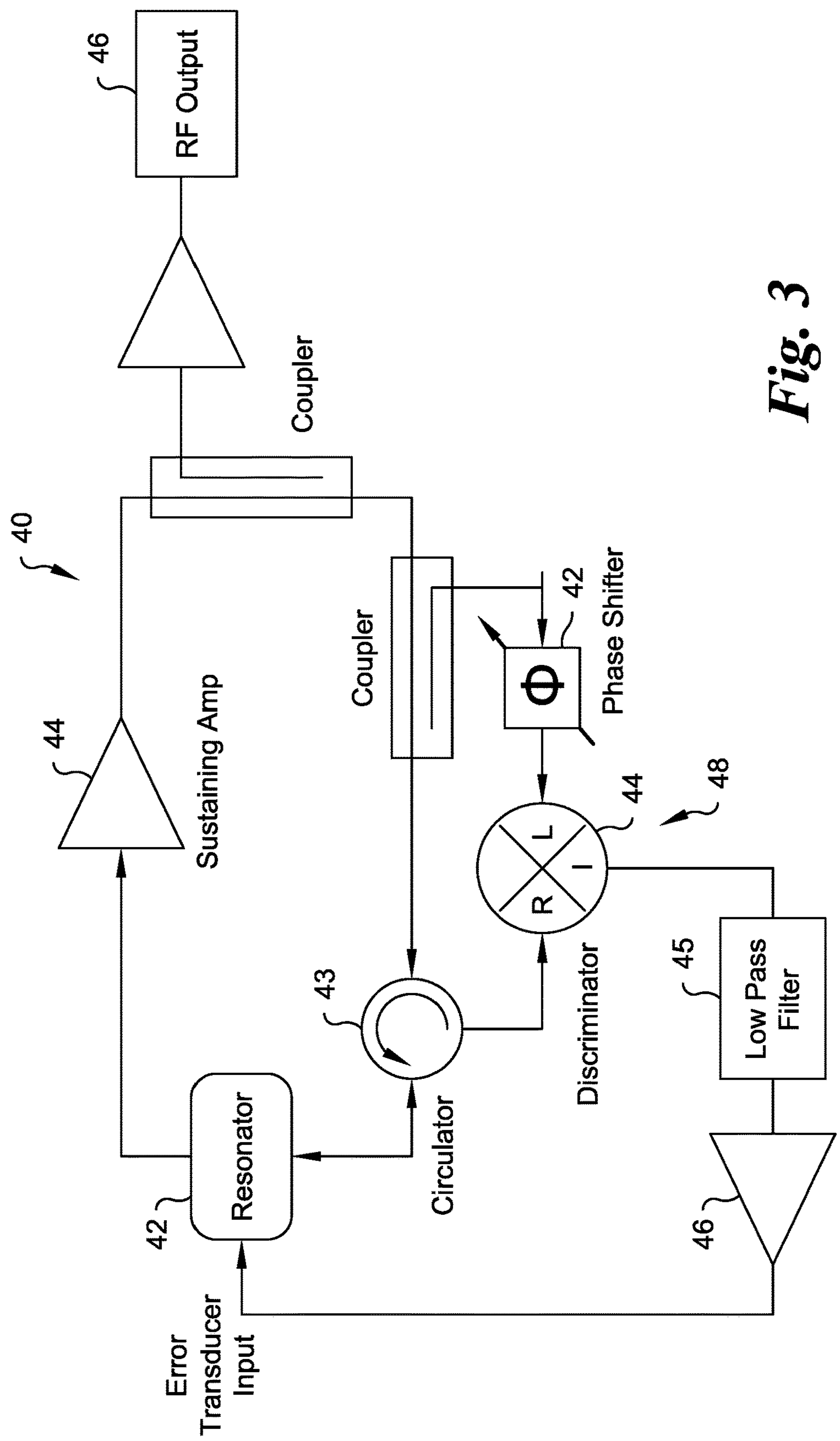
FIG. 3 illustrates an oscillator circuit including an improved phase noise cancellation scheme according to an embodiment of the present disclosure.

Embodiments of the present disclosure remedy one or more of the above-described drawbacks of conventional oscillator circuit phase noise cancellation techniques by providing phase error corrections at the resonator level rather than via a phase shifter as described above. Referring generally to FIG. 3, an oscillator circuit 40 having an improved phase noise correction scheme according to an embodiment of the present disclosure is provide. Similar to circuit 20 of FIG. 2, circuit 40 includes a SAW resonator 42 (the details of which will be described in reference to FIG. 4) having an output connected to a sustaining amplifier 44 used to drive resonator 42 in continuous oscillation via circulator 43, and provide a desired RF output signal 46.

Resonator circuit 40 comprises a phase noise error correction circuit, including a phase detector or discriminator circuit, embodied in the illustrated drawing as a quadrature detector 48. Quadrature detector 48 is configured to convert phase differences of two input signals into a voltage at the output of the circuit. As illustrated, quadrature detector 48 includes a phase shifter 42 (e.g., a delay line or LC network) configured to shift the phase of the output of sustaining amplifier 44 by 90 degrees. This phase-shifted signal is provided to a first input L of a frequency mixer 44. A second input R of frequency mixer 44 is responsive to a reflected signal from resonator 42 via circulator 43. Frequency mixer 44 is used to multiply the two input signals together and output a signal proportional to the phase difference between the two signals. If the phase difference of the two signals is equal to 90 degrees (quadrature), the voltage output will be zero after low pass filtering the difference frequency between the two input signals via low pass filter 45 and integrating via amplifier 46 (e.g., a Miller integrator) the output over time. However, any phase fluctuation from quadrature will result in a voltage fluctuation at the output of amplifier 46. Accordingly, the output of amplifier 46 defines a phase error correction signal, or a signal indicative of detected phase error over time. This error correction signal is supplied to an error correction transducer formed on resonator 42, as described with respect to FIG. 4, for achieving phase noise correction at the resonator level.

While the illustrated embodiments are shown as utilizing a quadrature detector, other phase detection schemes (e.g., a frequency discrimination scheme utilizing a delay line on one input of the frequency mixer and a phase shifter on the other input) may be implemented without departing from the scope of the present disclosure.

Figure 4:
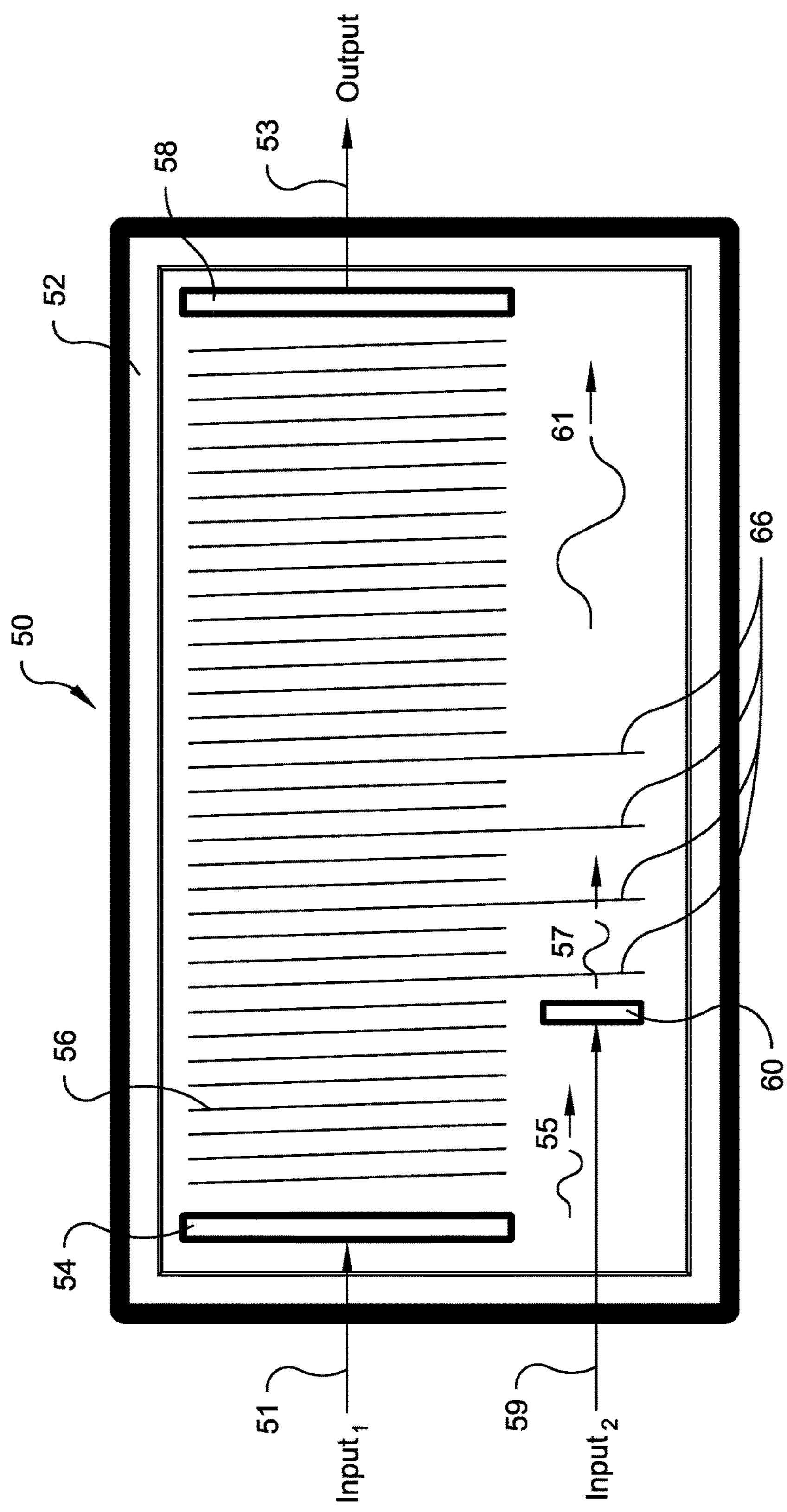
FIG. 4 illustrates a simplified MEMS resonator according to an embodiment of the present disclosure useful in the oscillator circuit of FIG. 3.

Referring generally to FIG. 4, an exemplary simplified SAW resonator 50 according to an embodiment of the present disclosure may be formed on a substrate 52 and includes a first input transducer 54 for converting a received first electrical input signal 51 to mechanical motion (i.e., SAWs 55). Input transducer 54 may comprise, for example, an electrostatic or piezoelectric interdigital transducer defining a plurality of electrodes or fingers. One or more resonator elements 56 may be formed on or in substrate 52 resulting in a grating defined across a surface of substrate 52. Each resonator element 56 may comprise a frequency-tuned length of diamond crystal deposited on the substrate (e.g., by vapor deposition), and subsequently etched (e.g., lithographically patterned or plasma etched) to produce finger-like resonating structures for achieving a desired resonance condition.

An output transducer 58 is also provided for converting mechanical substrate motion back to an oscillating electrical signal 53 of a desired frequency. Output transducer 58 may also comprise, for example, an electrostatic or piezoelectric interdigital transducer defining a plurality of electrodes or fingers. As will be understood by one of ordinary skill in the art, a desired output frequency of the resonator is realized by properly defining the pitch of the input and output transducers electrodes, as well as the placement of the resonator elements 56 formed or arranged there between.

Resonator 50 further comprises a second or error correction input transducer 60 for converting a received second electrical input signal 59 to mechanical motion of substrate 52 (i.e. SAWs 57). More specifically, second input transducer 60 is responsive to a phase error correction signal 59 provided by, for example, amplifier 46 of oscillator circuit 40. Second input transducer 60 may also comprise an electrostatic or piezoelectric interdigital transducer defining a plurality of electrodes or fingers. One or more resonator correction elements 66 may be formed on or in substrate 52 resulting in a second grating formed across a surface of substrate 52. Each resonator correction element 66 may also comprise a frequency-tuned length of diamond crystal deposited on the substrate, and subsequently etched to produce finger-like resonating structures for achieving a desired resonance condition. Resonator correction elements 66 may be interspersed between resonator elements 56. First and second input transducers 54,60 and resonator elements 56,66 are configured (e.g., sized and oriented) so as to provide a correction signal in a destructive 180 degree application to the secondary transducer in order to null the detected phase error in phase-corrected SAWs 61. The noise error correction signal is a baseband signal, and a fixed phase is adjusted to optimize the cancelation. The location, size and spacing of the resonator correction elements 66 are selected as a function of the frequency of oscillation and the maximum correction frequency (which is substantially less than the oscillation frequency). The implementation of exemplary resonator 50 into the oscillator circuit set forth above with respect to FIG. 3, results in an improved phase error cancellation scheme which eliminates the insertion losses present in the prior art solutions, allowing for a lower phase noise floor and improved performance.

Figure 5:
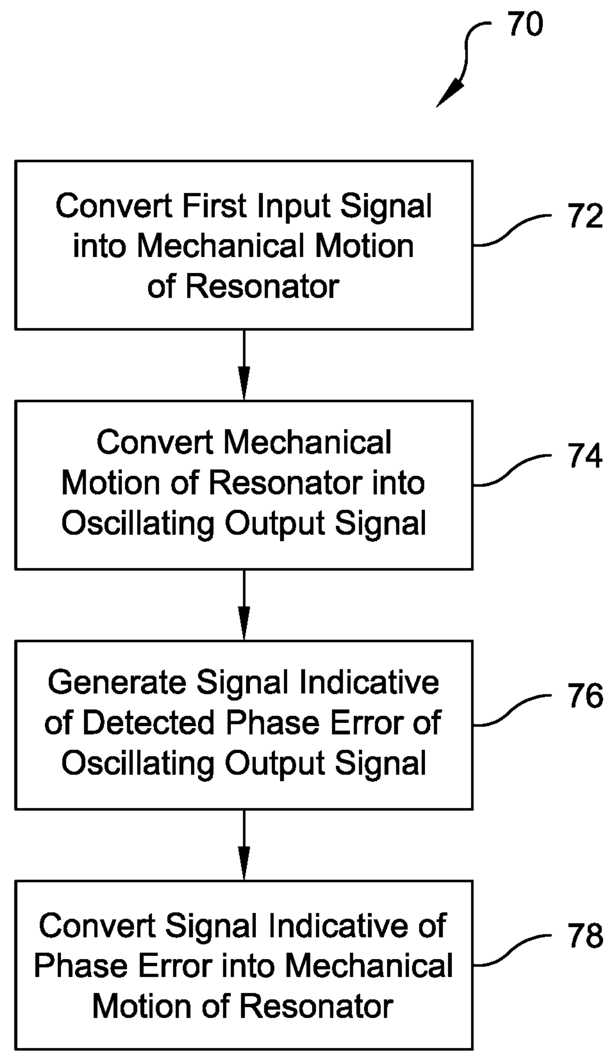
FIG. 5 is a simplified process diagram illustrating a phase error correction method according to an embodiment of the present disclosure.

Accordingly, embodiments of the present disclosure include an improved method of correcting phase error of an oscillating signal generated by a MEMS resonator. Referring generally to FIG. 5, the method 70 generally includes the steps converting 72 a first electrical signal into mechanical motion of the resonator with a first input transducer. The resulting mechanical motion of the resonator is converted 74 into an oscillating electrical signal by an output transducer. A phase detector is used to generate 76 an output signal indicative of a measured phase error in the oscillating signal. A second input transducer is provided for converting 78 the signal indicative of measured phase error into mechanical motion of the resonator for cancelling or otherwise mitigating phase errors.

While the foregoing invention has been described with reference to the above-described embodiment, various modifications and changes can be made without departing from the spirit of the invention. Accordingly, all such modifications and changes are considered to be within the scope of the appended claims. Accordingly, the specification and the drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations of variations of various embodiments. Combinations of the above embodiments, and other embodiments not specifically described herein, will be apparent to those of skill in the art upon reviewing the above description.

What is claimed is:

1. An oscillator circuit comprising:

a surface acoustic wave (SAW) resonator having:

a first input transducer responsive to a first input signal for transducing the first input signal into mechanical motion of a substrate material of the resonator;

a second input transducer responsive to a second input signal for transducing the second input signal into mechanical motion of the substrate material;

a first output transducer configured to transduce the mechanical motion of the substrate material into an output signal;

a feedback loop configured to generate the second input signal, wherein the second input signal is indicative of a phase error of the output signal of the resonator.

2. The circuit of claim 1, wherein the feedback loop comprises a phase detector responsive to an output of the resonator for generating an output signal indicative of a detected phase error, wherein the second input signal is indicative of the output of the phase detector.

3. The circuit of claim 2, wherein the feedback loop comprises an integrating circuit responsive to the output signal of the phase detector for generating the second input signal.

4. The circuit of claim 3, wherein the phase detector comprises:

a frequency mixer having a first input and a second input; and a phase shifter responsive to the output of the resonator for generating a phase shifted signal supplied to the first input of the frequency mixer.

5. The circuit of claim 4, wherein the integrating circuit is responsive to the output of the frequency mixer.

6. The circuit of claim 4, wherein the second input of the frequency mixer is responsive to the first input signal to the resonator.

7. The circuit of claim 4, wherein the second input of the frequency mixer is responsive to an oscillating signal originating from the resonator.

8. The circuit of claim 1, wherein the integrating circuit comprises a low pass filter.

9. The circuit of claim 1, wherein the substrate comprises a diamond substrate.

10. A microelectromechanical system (MEMS) resonator system comprising:

a resonator element having:

a first input transducer configured to receive a first input signal for transducing the first input signal into mechanical motion of a substrate material of the resonator element;

a second input transducer configured to receive a second input signal for transducing the second input signal into mechanical motion of the substrate material;

a first output transducer configured to transduce the mechanical motion of the substrate material into an output electrical signal;

wherein the second input signal is indicative of a phase error detected in the output electrical signal.

11. The system of claim 10, further comprising a plurality of resonator elements formed in the substrate material.

12. The system of claim 10, further comprising a phase detector responsive to an output of the resonator element for generating an output signal indicative of the detected phase error, wherein the second input signal is indicative of the output of the phase detector.

13. The system of claim 10, further comprising a sustaining amplifier configured to amplify the output electrical signal for generating the first input signal.

14. A method of correcting phase error of an oscillating signal generated by a microelectromechanical (MEMS) resonator comprising:

converting a first electrical signal into mechanical motion of the resonator with a first input transducer of the resonator;

converting the resulting mechanical motion of the resonator into an oscillating electrical signal with an output transducer of the resonator;

converting a second electrical signal indicative of a detected phase error of the oscillating signal into mechanical motion of the resonator with a second input transducer of the resonator.

15. The method of claim 14, wherein the steps of converting first and second electrical signals into mechanical motion of the resonator comprise generating respective first and second surface acoustic waves (SAWs).

16. The method of claim 14, further comprising the step of detecting the phase error associated with the oscillating electrical signal.

17. The method of claim 16, further comprising the step of integrating the detected phase error to generate the second input signal.

* * * * *